(12) United States Patent
Trujillo et al.

(10) Patent No.: US 9,240,513 B2
(45) Date of Patent: Jan. 19, 2016

(54) DYNAMIC SUPPORT SYSTEM FOR QUARTZ PROCESS CHAMBER

(75) Inventors: Robert T. Trujillo, Saratoga, CA (US); Steven C. Beese, Fremont, CA (US); Yan Rozenzon, San Carlos, CA (US)

(73) Assignee: SolarCity Corporation, San Mateo, CA (US)

( * ) Notice: Subject to any disclaimer, the term of this patent is extended or adjusted under 35 U.S.C. 154(b) by 1071 days.

(21) Appl. No.: 13/079,623

(22) Filed: Apr. 4, 2011

(65) Prior Publication Data

US 2011/0277688 A1 Nov. 17, 2011

Related U.S. Application Data

(60) Provisional application No. 61/334,972, filed on May 14, 2010.

(51) Int. Cl.
| | |
|---|---|
| *H01L 31/18* | (2006.01) |
| *F16F 15/027* | (2006.01) |
| *C23C 16/44* | (2006.01) |
| *C23C 16/52* | (2006.01) |
| *F16F 15/023* | (2006.01) |

(52) U.S. Cl.
CPC ............... *H01L 31/18* (2013.01); *C23C 16/44* (2013.01); *C23C 16/52* (2013.01); *F16F 15/027* (2013.01); *F16F 15/0232* (2013.01); *F16F 15/0275* (2013.01)

(58) Field of Classification Search
CPC ... F16F 15/0232; F16F 15/027; F16F 15/046; F16F 15/022; F16F 15/10; F16F 15/1421; F16F 15/163; F16F 15/165; F16F 15/0275; H01L 31/18; C23C 16/44; C23C 16/52
See application file for complete search history.

(56) References Cited

U.S. PATENT DOCUMENTS

| | | | |
|---|---|---|---|
| 3,603,284 A | 9/1971 | Garnache | |
| 3,658,585 A | 4/1972 | Folkmann | |
| 4,193,756 A * | 3/1980 | Leon | ................................. 432/3 |
| 4,839,145 A | 6/1989 | Gale | |
| 4,858,558 A | 8/1989 | Ohmura | |
| 5,038,711 A | 8/1991 | Dan | |
| 5,074,245 A | 12/1991 | Ota | |
| 5,119,540 A | 6/1992 | Kong | |

(Continued)

FOREIGN PATENT DOCUMENTS

| | | |
|---|---|---|
| JP | H11288890 A | 10/1999 |
| JP | 2003158054 A | 5/2003 |

(Continued)

OTHER PUBLICATIONS

Beaucarne, G et al., "Epitaxial thin-film Si solar cells", pp. 533-542, Science Direct, www.sciencedirect.com, Thin Solid Films 511-512 (2006) 533-542.

*Primary Examiner* — Jeffrie R. Lund
(74) *Attorney, Agent, or Firm* — Shun Yao; Park, Vaughan, Fleming & Dowler LLP

(57) ABSTRACT

One embodiment of the present invention provides a support system for providing dynamic support to a deposition reactor. The system includes a coupling mechanism configured to provide coupling between the deposition reactor and the support system, an attachment mechanism configured to attach the support system to an external frame, and at least one gas bellows situated between the coupling mechanism and the attachment mechanism.

11 Claims, 3 Drawing Sheets

(56) References Cited

U.S. PATENT DOCUMENTS

| | | |
|---|---|---|
| 5,269,847 A | 12/1993 | Anderson |
| 5,505,778 A | 4/1996 | Ono |
| 5,614,447 A | 3/1997 | Yamaga |
| 5,700,422 A * | 12/1997 | Usui et al. .................. 266/94 |
| 5,993,555 A | 11/1999 | Hamilton |
| 5,994,675 A | 11/1999 | Bethune |
| 6,120,605 A * | 9/2000 | Sato .............................. 118/715 |
| 6,193,804 B1 * | 2/2001 | Chang et al. ............... 118/733 |
| 6,214,116 B1 | 4/2001 | Shin |
| 6,262,393 B1 | 7/2001 | Imai |
| 6,399,510 B1 | 6/2002 | Riley |
| 6,472,639 B2 | 10/2002 | Nishitani |
| 6,478,923 B1 | 11/2002 | Igarashi |
| 8,288,645 B2 | 10/2012 | Lee |
| 2002/0004309 A1 * | 1/2002 | Collins et al. ............... 438/719 |
| 2002/0102859 A1 | 8/2002 | Yoo |
| 2003/0012885 A1 | 1/2003 | Gramarossa |
| 2003/0019428 A1 | 1/2003 | Ku |
| 2004/0135979 A1 * | 7/2004 | Hazelton ............... G03B 27/48 355/51 |
| 2005/0016956 A1 | 1/2005 | Liu |
| 2006/0006559 A1 | 1/2006 | Nakagawa et al. |
| 2006/0060791 A1 * | 3/2006 | Hazelton ................. G03F 7/709 250/441.11 |
| 2006/0191118 A1 * | 8/2006 | Lee et al. ........................ 29/240 |
| 2006/0201414 A1 * | 9/2006 | Brabant et al. ................. 117/89 |
| 2007/0131173 A1 * | 6/2007 | Halpin et al. ................. 118/728 |
| 2009/0117746 A1 | 5/2009 | Masuda |
| 2009/0139570 A1 | 6/2009 | Kinoshita |
| 2009/0311869 A1 | 12/2009 | Okesaku |
| 2010/0183825 A1 * | 7/2010 | Becker et al. ................. 427/569 |
| 2010/0263587 A1 | 10/2010 | Sivaramakrishnan |
| 2010/0313877 A1 * | 12/2010 | Bellman ................. F24J 2/055 126/653 |
| 2011/0067632 A1 | 3/2011 | Poppe |
| 2011/0277688 A1 * | 11/2011 | Trujillo ................. C23C 16/44 118/715 |

FOREIGN PATENT DOCUMENTS

| | | |
|---|---|---|
| JP | 2003277936 A | 10/2003 |
| JP | 2006080098 A | 3/2006 |
| KR | 20060117134 A | 11/2006 |

* cited by examiner

DYNAMIC SUPPORT SYSTEM FOR QUARTZ PROCESS CHAMBER

RELATED APPLICATION

This application claims the benefit of U.S. Provisional Application No. 61/334,972, entitled "Dynamic Support for Quartz Process Chamber," by inventors Robert T. Trujillo, Steven C. Beese, and Yan Rozenzon, filed 14 May 2010.

The subject matter of this application is related to the subject matter of U.S. patent application Ser. No. 12/355,463, entitled "Scalable, High-Throughput, Multi-Chamber Epitaxial Reactor for Silicon Deposition," by inventors Steve Poppe, Yan Rozenzon, David Z. Chen, Xiaole Yan, Peijun Ding, and Zheng Xu, filed 16 Jan. 2009, and U.S. patent application Ser. No. 12/880,941, entitled "Stackable Multiport Gas Nozzles," by inventors Steve Poppe, Yan Rozenzon, and Peijun Ding, filed 13 Sep. 2010, the disclosures of which are incorporated by reference in their entirety herein.

BACKGROUND

1. Field

This disclosure is generally related to deposition systems. More specifically, this disclosure is related to a system capable of providing dynamic support to the deposition chamber.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including single p-n junction, p-i-n/n-i-p, and multi-junction. A typical single p-n junction structure includes a p-type doped layer and an n-type doped layer of similar material. A heterojunction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi junction structure includes multiple semiconductor layers of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Materials that can be used to construct solar cells include amorphous silicon (a-Si), polycrystalline silicon (poly-Si), crystalline silicon (c-Si), cadmium telluride (CdTe), etc. FIG. 1 illustrates an exemplary crystalline-silicon thin-film solar cell. Solar cell 100 includes a low-grade crystalline-Si substrate 102, a p-type doped single-crystal Si layer 104, an n' silicon emitter layer 106, front electrodes 108, and an Al back electrode 110. Arrows in FIG. 1 indicate incident sunlight.

Based on industrial surveys, c-Si wafer-based solar cells dominate nearly 90% of the market. However, the cost of producing c-Si wafer-based solar cells is high, and the waste of Si material during the ingot-cutting process and the wafer-polishing process has caused a bottleneck in the supply of crystalline-Si wafers. Due to the soaring price and the supply shortage of Si material, there has been a great interest in alternative ways to manufacture solar cells. Recently, photovoltaic thin-film technology has been drawing vast interest because it can significantly reduce the amount of material used, thus lowering the cost of solar cells. Among various competing technologies, single-crystal Si thin-film solar cells have drawn great interest for their low cost and high efficiency.

Single-crystal Si thin-film solar cells can be created using conventional semiconductor epitaxy technologies which not only reduce manufacturing costs but also enable flexible doping levels in the emitter, absorber and back surface field of the solar cell, thus enhancing its efficiency. Single-crystal Si thin-film solar cells with an efficiency as high as 17% have been demonstrated in research labs (see M. Reutuer et al., "17% Efficient 50 µm Thick Solar Cells," *Technical Digest, 17th International Photovoltaic Science and Engineering Conference*, Fukuoka, Japan, p. 424).

A high-quality single-crystal Si thin film can be produced using Si epitaxy, which has been widely used in the semiconductor industry to create a high-quality single-crystal Si layer for CMOS integrated circuits, power devices and high-voltage discrete devices. Among possible Si epitaxial deposition techniques, trichlorosilane (TCS) based chemical vapor deposition (CVD) can provide a deposition rate of up to 10 µm/min. Therefore, it is possible to achieve a high-throughput and low-cost epitaxial process for solar cell application.

However, there is a lack of suitable Si epitaxy tools that can meet the demand for high throughput and low deposition cost for Si film layers with thicknesses up to tens of microns, as required by the solar cell industry. Existing Si epitaxy tools, such as AMC7810™ and Centura 5200™ by Applied Materials, Inc., of Santa Clara, Calif., US; MT7700™ by Moore Epitaxial, Inc., of Tracy, Calif., US; PE2061™ by LPE Epitaxial Technology of Italy; and Epsilon 3200™ by ASM International of the Netherlands, are optimized for the needs of semiconductor device manufacturing. Although these epitaxial tools can deliver Si films with the highest quality, these tools are not compatible, in terms of throughput and gas conversion efficiency, with the economics of the solar cell industry.

FIG. 2 presents a diagram illustrating the structure of an existing barrel epitaxial reactor (prior art), such as that used for the batch processing of multiple wafers. Barrel reactor 200 includes a reaction chamber 202, which has a gas inlet 204 at the top and a vent 206 at the bottom. A vertically positioned susceptor 208 holds a number of wafers, such as wafer 210. Radio frequency (RF) heating coils 212 radiate heat onto the susceptor and wafers. Although barrel reactor 200 can batch process multiple wafers, the number of wafers it can process is limited by the architect of the system, the size of the chamber, and the design of the susceptor. Once built, it is difficult to modify the reactor or the susceptor to accommodate more wafers. In addition, the susceptor needs to be rotated during deposition in order to allow a uniform gas flow over each wafer during the deposition process.

SUMMARY

One embodiment of the present invention provides a support system for providing dynamic support to a deposition reactor. The system includes a coupling mechanism configured to provide coupling between the deposition reactor and the support system, an attachment mechanism configured to attach the support system to an external frame, and at least one gas bellows situated between the coupling mechanism and the attachment mechanism.

In a variation on this embodiment, the system further includes a pressure regulator configured to regulate the pressure within the gas bellows.

In a further variation, the pressure regulator regulates the pressure within the gas bellows by allowing pressurized gas to enter or exit the gas bellows, thereby facilitating a relative position change between the coupling mechanism and the attachment mechanism.

In a further variation, the pressurized gas includes inert gas.

In a variation on this embodiment, the support system is situated below the deposition reactor.

In a variation on this embodiment, the support system is situated above the deposition reactor.

In a variation on this embodiment, the coupling mechanism includes a platform that is in contact with one end of the deposition reactor.

In a variation on this embodiment, the attachment mechanism includes a mount bracket that includes a vertical surface and a horizontal surface. The vertical surface is mounted to the external frame, and the horizontal surface is coupled to the gas bellows.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a system that can actively support heavy manifolds coupled to a reaction chamber. The support system includes a regulated, gas-filled bellows. The system regulates the amount of gas contained in the bellows by using a regulator to set the bellows pressure. When the quartz chamber expands due to increased temperature, the pressure imposed on the bellows increases, resulting in certain amount of gas being released from the bellows through the regulator. The deflated bellows releases any tensile stress that results from the thermal mismatch between the quartz chamber and other metal components, thus preventing fracture of the quartz chamber.

Chamber and Gas Delivery/Exhaust Systems

Figure 3:
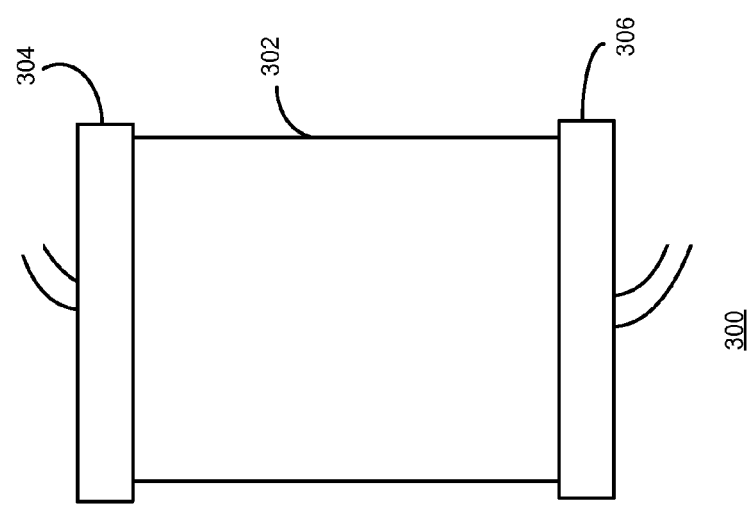
FIG. 3 presents a diagram illustrating a side view of an exemplary deposition reactor in accordance with an embodiment of the present invention.

FIG. 3 presents a diagram illustrating a side view of an exemplary deposition reactor in accordance with an embodiment of the present invention. In this example, deposition reactor 300 includes a reactor chamber 302, and a pair of gas delivery/exhaust systems 304 and 306.

Silicon deposition often requires high operation temperatures, sometimes as high as 1200° C. To achieve such a high temperature, halogen lamps can be used to provide radiant energy that is absorbed by substrate-holding susceptors located inside the chamber. Quartz is often used to form the reaction chamber, because it is transparent to radian heat and is able to withstand high temperatures.

To facilitate the transfer of reaction gas into and exhaust out of the quartz chamber, gas manifolds made of stainless steel (304 and 306 in FIG. 3) are rigidly secured to the top and bottom of the quartz chamber. Because they are relatively heavy, supports for both stainless steel manifolds are needed. If only one end is supported by or attached to a supporting frame, the weight of the stainless steel components on the opposite side can exceed the strength of the quartz, leading to fracture of the chamber. In a traditional system, the stainless steel manifolds on both ends of the chamber are rigidly attached to supporting structures to provide sufficient mechanical support. However, this arrangement does not consider the thermal expansion mismatch between the quartz chamber and the metal components, which can result in great tensile stress being applied to the quartz chamber. Note that when such stress exceeds the limitation of the quartz, the chamber may fracture.

Figure 1:
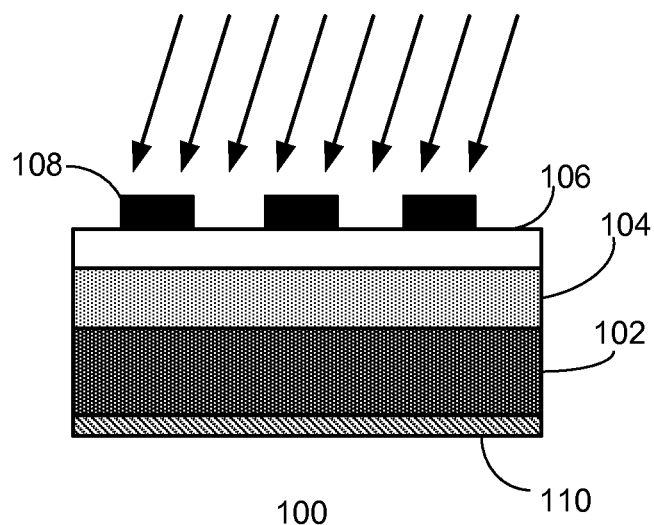
FIG. 1 presents a diagram illustrating the structure of an exemplary crystalline-Si thin-film solar cell.
Figure 2:
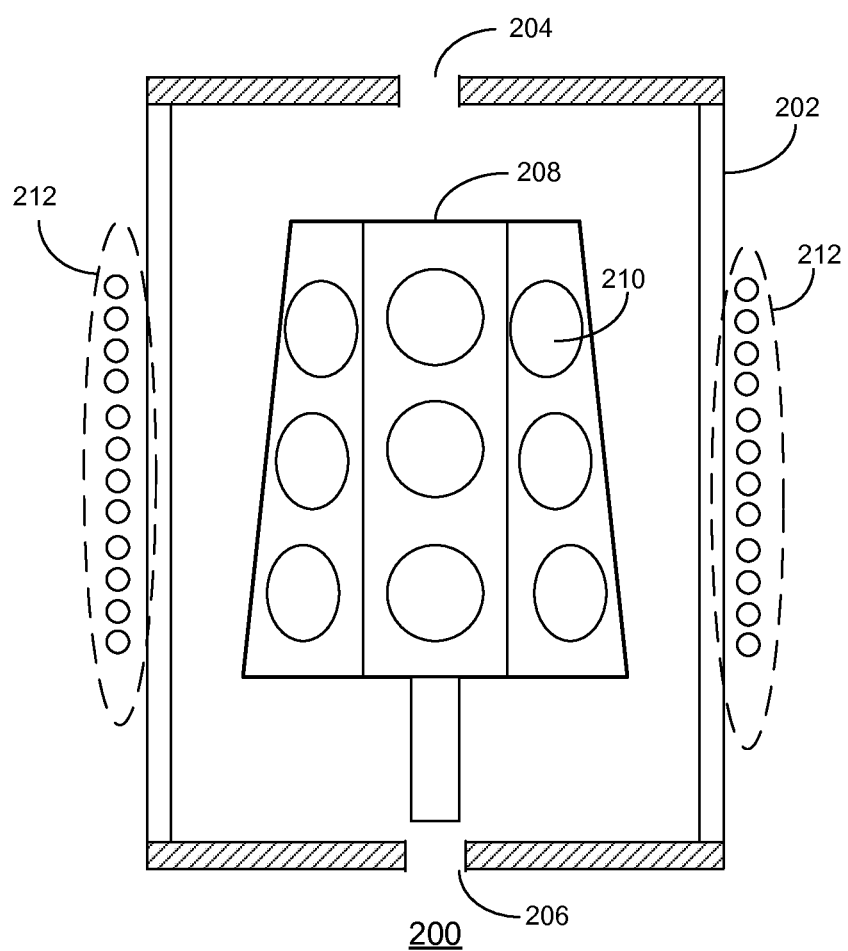
FIG. 2 presents a diagram illustrating an existing barrel reactor (prior art).
Figure 4A:
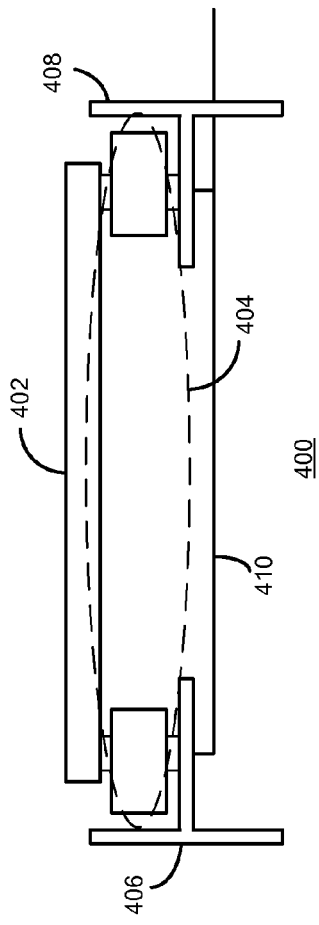
FIG. 4A provides a diagram illustrating the structure of a dynamic support system in accordance with an embodiment of the present invention.

To solve this problem, embodiments of the present invention provide a dynamic support mechanism that not only provides upward force to offset the weight of the heavy gas delivery/exhaust system, but also allows the quartz chamber to fluctuate in length when temperature changes, thus preventing the quartz chamber from fracturing. FIG. 4A provides a diagram illustrating the structure of a dynamic support system in accordance with an embodiment of the present invention.

Dynamic support system 400 includes a support platform 402, a gas bellows assembly 404, a pair of mount brackets 406 and 408, and a pressurized gas line 410. Support platform 402 provides coupling to the gas delivery/exhaust system. In one embodiment, the bottom stainless steel manifold sits on top of support platform 402. Mount brackets 406 and 408 can be attached to an external structure, such as a metal frame structure that houses the entire reactor. In one embodiment, mount brackets 406 and 408 are shaped like a "T." The vertical surface of the "T" is mounted to the external frame, and gas bellows assembly 404 is placed in between support platform 402 and the horizontal surface of the "T" of mount brackets 406 and 408. Support platform 402 and mount brackets 406 and 408 can be made of meal, such as stainless steel. Because the bellows of gas bellows assembly 404 can deflate or inflate in response to pressure changes, the relative distance between support platform 402 and mount brackets 406 and 408 changes accordingly. This arrangement makes it possible for dynamic support system 400 to release possible tensile stress applied to the quartz chamber resulting from temperature changes while providing upward support to the chamber. FIG.

4B presents a diagram illustrating a three-dimensional view of the dynamic support system.

Figure 4B:
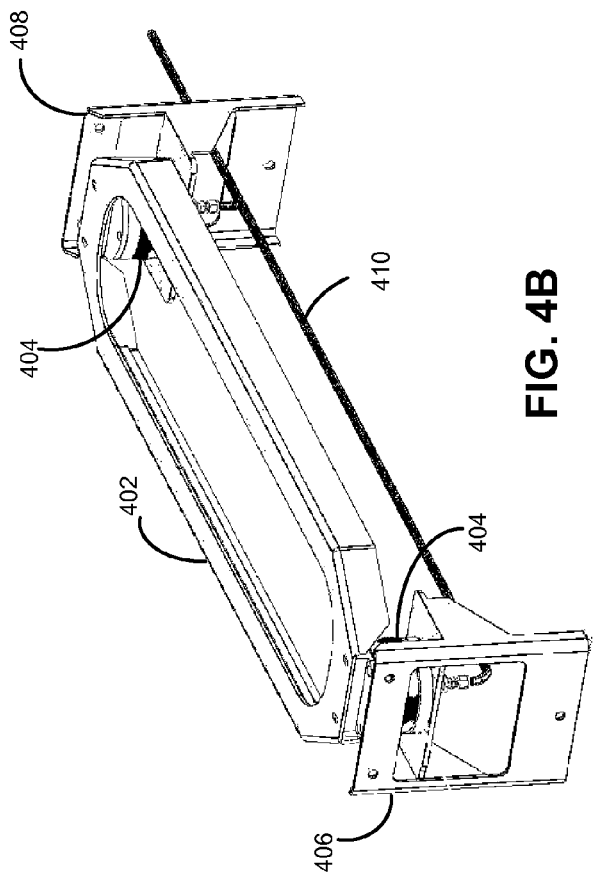
FIG. 4B presents a diagram illustrating a three-dimensional view of the dynamic support system.
Figure 4C:
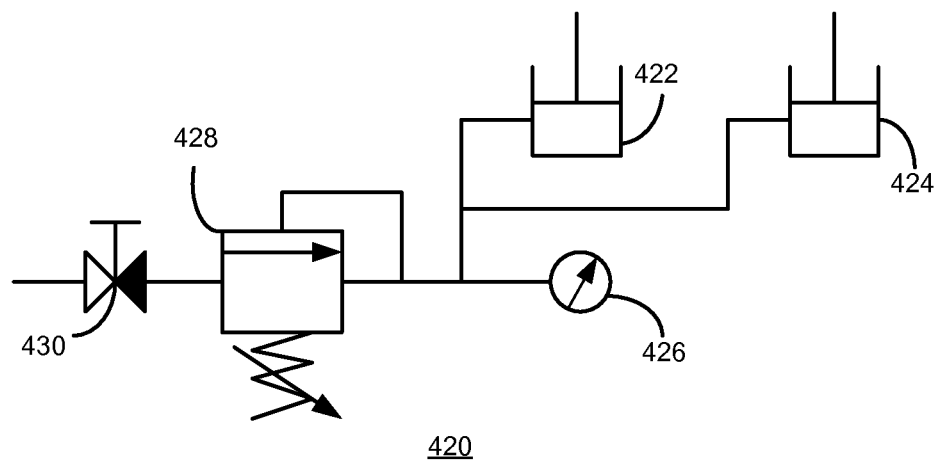
FIG. 4C presents a diagram illustrating details of the gas bellows assembly in accordance with an embodiment of the present invention.

FIG. 4C presents a diagram illustrating details of the gas bellows assembly in accordance with an embodiment of the present invention. Gas bellows assembly 420 includes a pair of bellows 422 and 424, a pressure gauge 426, a pressure regulator 428, and a bidirectional valve 430. Bellows 422 and 424 are filled with pressurized gas, and are thus capable of providing upward support to load positioned above them. Air or other types of gas can be used to fill bellows 422 and 424. In one embodiment, inert gases are used to fill gas bellows 422 and 424.

Bellows 422 and 424 are coupled to pressure gauge 426, pressure regulator 428, and bidirectional valve 430 via gas pipes. These three components work together to maintain the internal pressure of bellow 422 and 424 at a predetermined value. Pressure gauge 426 measures the internal pressure within bellows 422 and 426, and pressure regulator 428 regulates the internal pressure by controlling the opening and closing of bidirectional valve 430. If the measurement of pressure gauge 426 exceeds the set pressure point, pressure regulator 428 will control bidirectional valve 430 to open outwardly to allow gas to escape from bellows 422 and 424. Consequently, bellows 422 and 424 deflate, and their internal pressure is reduced to the set point. On the other hand, if the measurement of pressure gauge 426 is less than the set pressure point, pressure regulator 428 will control bidirectional valve 430 to open inwardly to allow pressurized gas to enter bellows 422 and 424 from an external gas supply (not shown). Consequently, bellows 422 and 424 inflate, and their internal pressure is increased to the set point.

Figure 5:
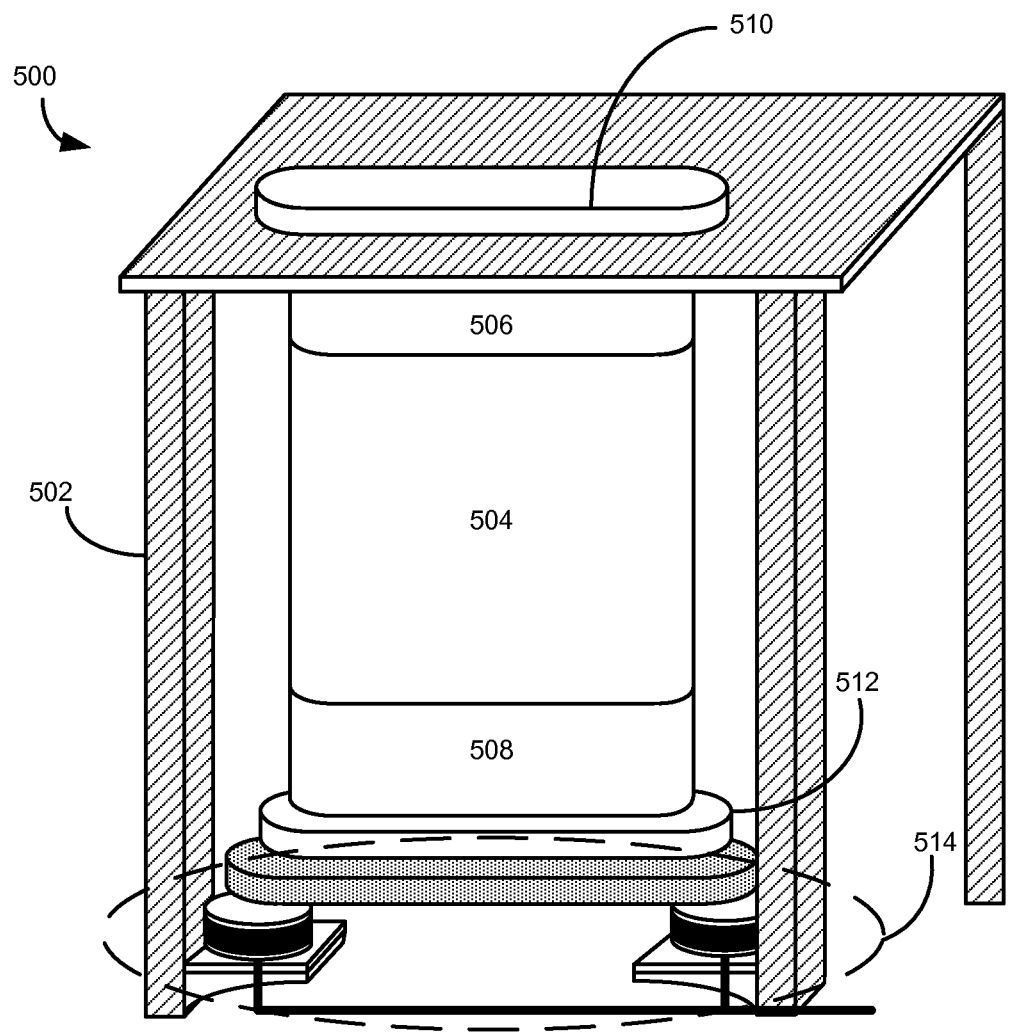
FIG. 5 presents a diagram illustrating a partial view of a deposition tool in accordance with an embodiment of the present invention.

FIG. 5 presents a diagram illustrating a partial view of a deposition tool in accordance with an embodiment of the present invention. Deposition tool 500 includes an external frame 502, a chamber 504, a pair of gas nozzles 506 and 508, a pair of gas manifolds 510 and 512, and a dynamic supporting assembly 514. Detailed descriptions of the complete deposition tool can be found in U.S. patent application Ser. No. 12/355,463, entitled "Scalable, High-Throughput, Multi-Chamber Epitaxial Reactor for Silicon Deposition," by inventors Steve Poppe, Yan Rozenzon, Davis Z. Chen, Xiaole Yan, Peijun Ding, and Zheng Xu, filed 16 Jan. 2009, the disclosures of which are incorporated by reference in their entirety herein.

External frame 502 provides housing and support for the other components, such as chamber 504, gas nozzles 506 and 508, and gas manifolds 510 and 512, belonging to deposition tool 500. Note that multiple chambers can be housed in one external frame to form a multi-chamber deposition tool. Gas nozzles 506 and 508 are attached to the upper end and the lower end of chamber 504. Detailed descriptions of gas nozzles 506 and 508 can be found in U.S. patent application Ser. No. 12/880,941, entitled "Stackable Multi-port Gas Nozzles," by inventors Steve Poppe, Yan Rozenzon, and Peijun Ding, filed 13 Sep. 2010, the disclosures of which are incorporated by reference in their entirety herein. Gas manifolds 510 and 512 provide gas input/output to chamber 504 via gas nozzles 506 and 508, respectively.

In FIG. 5, gas manifold 510 is directly attached to external frame 502 using a conventional method that can rigidly couple two metal components. On the other hand, manifold 512 is coupled to external frame 502 via dynamic supporting assembly 514. More specifically, manifold 512 is attached to the support platform of dynamic supporting assembly 514, which is mounted to external frame 502. By combining FIGS. 4 and 5, one can see that when chamber 504 expands thermally, extra pressure will be added to the bellows of dynamic supporting assembly 514. In response, the bellows deflate to provide room for chamber 504 to expand, thus releasing any possible tensile pressure exerted on the quartz material that made up chamber 504. On the other hand, the bellows inflate when chamber 504 contracts, also eliminating possible tensile stress.

Incorporating a dynamic supporting assembly into the deposition tool prevents possible fracture of the chamber and/or nozzles, which are made of quartz, thus significantly reducing the operation cost of the deposition tool.

Note that FIGS. 4 and 5 only present an exemplary structure of the dynamic supporting assembly and other configurations are also possible. For example, instead of providing support from the bottom of the reaction chamber as shown in FIGS. 4 and 5, it is also possible to attach the dynamic supporting assembly to the upper manifold. In addition, in the example shown in FIGS. 4 and 5, two bellows are used in the dynamic supporting assembly. However, it is possible to user fewer or more bellows, as long as they provide release of possible tensile stress to the reactor chamber. Similarly, fewer or more mount brackets, or other methods can be used to attach the dynamic supporting assembly to the external frame. In addition, the mount brackets can be made into other shapes. For example, instead of the"T," the mount brackets can be made into an "L" shape.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A system for providing support to a deposition reactor to prevent thermal stress fracture, the system comprising:
   a horizontally oriented platform positioned below and coupled to the deposition reactor, wherein a top portion of the deposition rector is attached to an external frame at an attachment point;
   an attachment mechanism positioned below the horizontally oriented platform and attached to the external frame;
   at least one gas bellows positioned between the platform and the attachment mechanism; and
   a pressure regulating mechanism coupled to the gas bellows and configured to automatically regulate gas pressure inside the gas bellows to move the platform to allow the attachment point of the top portion of the deposition reactor to remain at a same position while the deposition reactor expands or contracts due to temperature changes.

2. The support system of claim 1, wherein the pressure regulating mechanism regulates the pressure within the gas bellows by allowing pressurized gas to enter or exit the gas bellows.

3. The system of claim 2, wherein the pressurized gas includes inert gas.

4. The system of claim 1, wherein the horizontally oriented platform is in direct contact with a bottom surface of the deposition reactor.

5. The system of claim 1, wherein the attachment mechanism includes a mount bracket comprising a vertical surface and a horizontal surface, wherein the vertical surface is mounted to the external frame, and wherein the horizontal surface is coupled to the gas bellows.

6. A deposition tool, comprising:
   an external frame;

a reactor that includes a chamber, a top gas delivery mechanism positioned above and coupled to a top portion of the chamber, and a bottom gas delivery mechanism positioned below and coupled to the chamber, wherein the top gas delivery mechanism is attached to the external frame at an attachment point; and a support system coupling together the external frame and the reactor, wherein the support system comprises:

a horizontally oriented platform positioned below the bottom gas delivery system, thereby providing support to the reactor;

an attachment mechanism attached to the external frame;

at least one gas bellows positioned between the platform and the attachment mechanism; and a pressure regulating mechanism coupled to the gas bellows and configured to automatically regulate gas pressure inside the gas bellows to move the platform to allow the attachment point to remain at a same position while the chamber expands or contracts due to temperature changes.

7. The deposition tool of claim 6, wherein the pressure regulating mechanism regulates the pressure within the gas bellows by allowing pressurized gas to enter or exit the gas bellows.

8. The deposition tool of claim 7, wherein the pressurized gas includes inert gas.

9. The deposition tool of claim 6, wherein the horizontally oriented platform is in direct contact with the bottom gas delivery mechanism.

10. The deposition tool of claim 6, wherein the attachment mechanism includes a mount bracket comprising a vertical surface and a horizontal surface, wherein the vertical surface is mounted to the external frame, and wherein the horizontal surface is coupled to the gas bellows.

11. The deposition tool of claim 6, wherein the chamber is made of a material that includes quartz, and wherein the gas delivery mechanisms are made of a material that includes metal.

\* \* \* \* \*

UNITED STATES PATENT AND TRADEMARK OFFICE
CERTIFICATE OF CORRECTION

PATENT NO.         : 9,240,513 B2
APPLICATION NO.    : 13/079623
DATED              : January 19, 2016
INVENTOR(S)        : Robert T. Trujillo et al.

It is certified that error appears in the above-identified patent and that said Letters Patent is hereby corrected as shown below:

IN THE CLAIMS

In claim 2 (at column 6, line 52), please delete the word, "support" so the line reads "the system of claim 1, wherein the pressure".

Signed and Sealed this
Twelfth Day of April, 2016

Michelle K. Lee
*Director of the United States Patent and Trademark Office*